United States Patent [19]

Nakamura et al.

[11] Patent Number: 5,785,755
[45] Date of Patent: Jul. 28, 1998

[54] METHOD OF GROWING MULTILAYER CRYSTAL FILMS BY METAL ORGANIC VAPOR PHASE EPITAXY

[75] Inventors: Takahiro Nakamura; Satoshi Ae, both of Tokyo, Japan

[73] Assignee: NEC Corporation, Japan

[21] Appl. No.: 616,351

[22] Filed: Mar. 15, 1996

[30] Foreign Application Priority Data

Mar. 15, 1995 [JP] Japan .................................. 7-055664

[51] Int. Cl.$^6$ .................................................. C30B 25/02
[52] U.S. Cl. .......................... 117/104; 117/88; 117/89; 117/93; 427/255.2; 427/255.7
[58] Field of Search .......................... 117/85, 88, 89, 117/93, 104; 427/255.2, 255.7

[56] References Cited

U.S. PATENT DOCUMENTS

| 5,379,220 | 1/1995 | Kuramata | 117/104 |
| 5,384,151 | 1/1995 | Razeghi | 427/58 |

FOREIGN PATENT DOCUMENTS 5-102039  4/1993  Japan .

OTHER PUBLICATIONS

McCrary et al.; "Low Pressure MOCVD in a vertical reactor:growth and characterization of InGaAsP on (100) InP for 1.3 μm lasers"; 1991; pp. 39–46; Journal of Crystal Growth, vol. 112, No. 1, May 11, 1991.
Horita et al; "MOVPE Growth of InGaAsP using TBA and TBP with extremly low V/III ratio"; Nov. 1, 1992; pp. 123–128; Journal of Crystal Growth, vol. 124, No. 1/4.

*Primary Examiner*—Felisa Garrett
*Attorney, Agent, or Firm*—Hayes, Soloway, Hennessey, Grossman & Hage, P.C.

[57] ABSTRACT

Disclosed are methods of preparing multilayer structures with InGaAsP layers of different compositions by metal organic vapor phase epitaxy, which result in formation of sharp heterointerfaces. After an InGaAsP well layer has been grown, the process is kept on standby with a flow of $AsH_3$ and $PH_3$, which are sources comprising elements of group V, at the well's composition ratios, and then with a flow of a source comprising an element of group V, including TBP (TBP/standby step), and an InGaAsP barrier layer is grown which has a smaller arsenic content than the well layer. TBP has a decomposition temperature approximately 100° C. lower than $PH_3$, and thus provides a phosphorus pressure which is five times or more as high as that of $PH_3$ at identical growth temperatures and at identical V/III ratios. Therefore, during the process of growth of multilayer InGaAsP films, TBP may be used in a standby step with a flow of a source comprising an element of group V at the same composition ratio as is designed for an InGaAsP layer which has a smaller arsenic content than the previously grown layer and is subsequently grown, to prevent arsenic desorption from chamber walls and group V species desorption from the exposed interfaces, thus realizing sharp heterointerfaces.

7 Claims, 3 Drawing Sheets

5,785,755

METHOD OF GROWING MULTILAYER CRYSTAL FILMS BY METAL ORGANIC VAPOR PHASE EPITAXY

BACKGROUND OF THE INVENTION

1. Field of the Invention

The present invention relates to a method of crystal growth by metal organic vapor phase epitaxy, and more particularly to a method of growing multilayer films of InGaAsP crystal layers having at least different group V element compositions by metal organic vapor phase epitaxy.

2. Description of the Related Art

Most lasers for use in subscriber system optical communications require small driving currents at high temperatures and have InGaAsP multiple quantum well (MQW) structures. In cases where such MQW structures have sharp heterointerfaces, injected carriers are satisfactorily caught in the well layers owing to low non-radiative recombination rates at the interfaces, thus realizing small driving currents at high temperatures. In metal organic vapor phase epitaxy (MOVPE) of an InGaAsP MQW structure according to the conventional art, after the well layer was grown, the growth sequence is kept on standby with a flow of arsine ($AsH_3$) and phosphine ($PH_3$), the sources for the group V elements, first with the same flow rate as for the well layer, and then with a flow of $AsH_3$ and $PH_3$ designed for the barrier layers, which is subsequently grown. The quality of the interface was optimized through optimization of the standby times. Since the InGaAsP barrier layer has a greater bandgap than the InGaAsP well layer, the composition ratio of arsenic in the barrier layer must be smaller than that in the well layer.

When the above mentioned method was used to optimize the interface, the following shortcomings are evident. That is, excess arsenic is taken into the barrier layer for standby times shorter than required, whereas for longer standby times, arsenic is desorbed from the growth surface due to insufficient overpressure of arsenic. This causes defects and changes in the composition at the interface, and results in failure to form a narrow interface in InGaAs multilayer films having different compositions. With semiconductor lasers fabricated with such multilayer InGaAsP films, it is difficult to accomplish small threshold currents and high slope efficiencies.

SUMMARY OF THE INVENTION

It is an object of the present invention to provide a method of metal organic vapor phase epitaxy to grow a multilayer crystal film of InGaAsP, where the layers have at least different group V element compositions. The invention is characterized in that tertiary-butyl phosphine (TBP) is used in a step of keeping the growth sequence on standby with a flow of a source gas used for growing an InGaAsP barrier layer which subsequently will be grown with a smaller arsenic content than the previously grown InGaAsP layer. This standby step is hereafter referred to as the TBP/standby step).

It is another object of the present invention to provide a modification of the above method of growing multilayer crystal films by metal organic vapor phase epitaxy, characterized in that the TBP/standby step is performed with a flow of TBP alone in between a standby step with a flow of a source gas having a same composition and flow rate ratios as the previously grown InGaAsP layer, and a standby step with a flow of a source gas having a same composition and flow rate ratio for an InGaAsP layer which is subsequently grown and has a smaller arsenic content than the former InGaAsP layer.

It is an additional object of the present invention to provide another modification of the above-mentioned method of growing multilayer crystal films by metal organic vapor phase epitaxy, characterized in that phosphine is introduced in addition to TBP in the TBP/standby step.

TBP, which has a decomposition temperature approximately 100° C. lower than $PH_3$, is believed to provide a phosphorus pressure which is five times or more as high as that of $PH_3$ at the same growth temperatures and at the same V/III gas supply ratios, (molar ratio). This high phosphorus pressure prevents desorption of residual arsenic from the deposition chamber walls and of group V element atoms exposed at the growth interface. Therefore, during the process of growing multilayer InGaAsP films, TBP can be effectively used during a standby step with a flow of a source gas designed for an InGaAsP layer which has a smaller arsenic content than the previously grown InGaAsP layer and which is to be subsequently grown, so as to prevent arsenic desorption from the chamber walls as well as from the growth interfaces and thus realizing sharp heterointerfaces.

In addition, due to accelerated decomposition of the $PH_3$ in the presence of the TBP, the combined use of TBP and $PH_3$ results in a higher phosphorus pressure than in the cases where TBP alone is used. Thus, the desorption of arsenic is prevented more efficiently to realize sharp heterointerfaces between the InGaAsP layers. It should be noted that, the Japanese Unexamined Patent Application Disclosure HEI 5-102039 describes, with reference to FIG. 1 appended thereto, a growth suspension step in the process of growth of InGaAsP/InP by MOVPE, wherein the process is kept on standby with a flow of either TBA and TBP combined, or TBP alone after the growth of the InGaAsP, but before the growth of the InP. That invention disclosed in the official gazette is a solution to a problem which is encountered in the growth of the InP, different from the problem of the growth of multilayer InGaAsP films to be solved by the present invention; the operations and the effects are also different.

BRIEF EXPLANATION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

Figure 1:
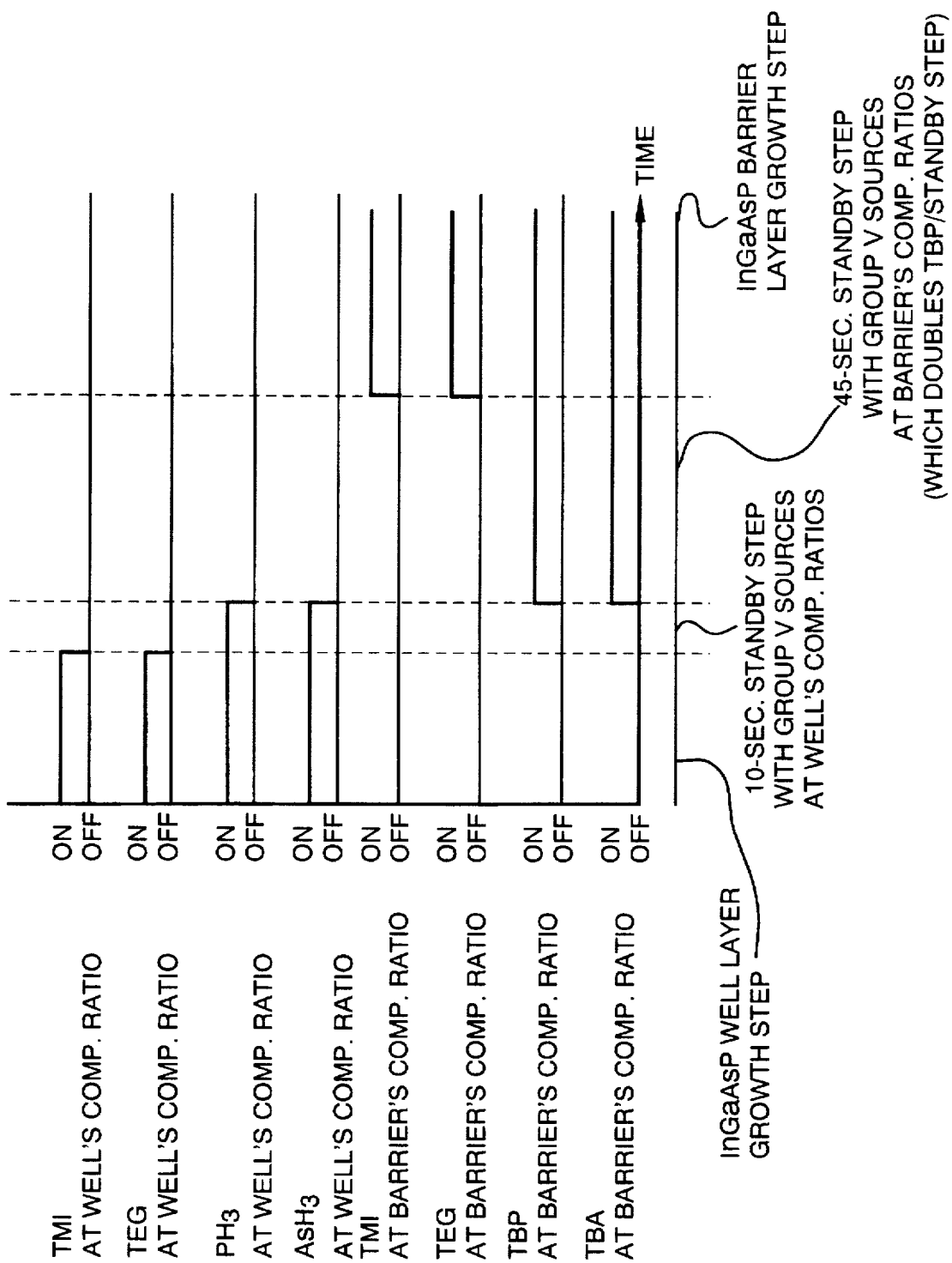
FIG. 1 is a view illustrative of a gas changeover sequence for transition from a well layer to a barrier layer during the process of growth of an InGaAsP MQW structure according to the present invention.

FIG. 1 is a view illustrative of a gas changeover sequence for growth of an InGaAsP MQW structure according to a method by metal organic vapor phase epitaxy which is the invention as claimed in claim 1. The present embodiment will be explained regarding the case of a MQW structure comprising an InGaAsP well layer of composition for a wavelength of 1.4 μm, and an InGaAsP barrier layer of composition for a wavelength of 1.13 μm. In addition, the standby time for the interface from a barrier layer to a well layer is set to zero seconds.

A horizontal low-pressure MOVPE system equipped with a susceptor-rotating mechanism was used for growth. The growth temperature was set to 650° C., and the growth pressure to 150 Torr. For the growth of a well layer, there were used trimethyl indium (TMI) and triethyl gallium (TEG) as sources for group III elements, and AsH₃ and PH₃ as sources for group V elements with a V/III ratio (molar ratio of group V element sources to group III element sources) of 140. For the growth of a barrier layer, TMI and TEG were used as group III sources, and TBA and TBP as group V sources with a V/III ratio of 60. After the well layer was grown, flow of group III sources for the well layer was suspended, and the process was kept on standby for 10 seconds with only a flow of the group V (PH₃ and AsH₃) sources with the same composition ratios as in the well layer (standby with group V sources at the well's composition ratios). Then, but prior to the growth of a barrier layer, the process was kept on standby for 45 seconds with only a flow of group V (TBP and TBA) sources with the same composition ratios as were predetermined for the barrier layer (standby with group V sources at the barrier's composition ratios which also functions as the TBP/standby). Thereafter, a flow of group III sources for the barrier layer was introduced to grow the barrier layer, thus realizing an InGaAsP MQW structure. Although the present embodiment is an example of the case where the step of standby with group V sources at the barrier's composition ratios functions as the TBP/standby step, the TBP/standby step with a flow of TBP alone may first be carried out, and the step of standby with group V sources at the barrier's composition ratios which uses TBP and TBA may then be carried out to grow the barrier layer.

Separately, in order to optimize an InGaAsP MQW structures as described above, ASH₃ and PH₃ were used as sources for group V elements for growing a barrier layer at a V/III ratio of 250 to grow the structure while varying, from 0 to 100 seconds, the standby time during which the group V sources flow prior to the growth of the barrier layer. As a result, the photoluminescent line width at half maximum, which is an indicator of the sharpness and quality of an heterointerface, was found to be minimal when the standby time was 20 seconds.

These two types of MQWs were buried in a DCPBH structure to prepare a semiconductor laser which was then tested with the following results: for cavity length=300 μm, 30% front coating and 70% back coating, the threshold current was 20 mA, and the slope efficient was 0.3 W/A at 85° C., for the case where TBA and TBP were used as the group V sources for the barrier layer, whereas the threshold current was 25 mA, and the slope efficient was 0.25 W/A for the case where AsH₃ and PH₃ were used. Since the TBP/standby step contributed to formation of a sharp heterointerface between the InGaAsP well and barrier layers, the characteristics of the semiconductor laser were improved.

Figure 2:
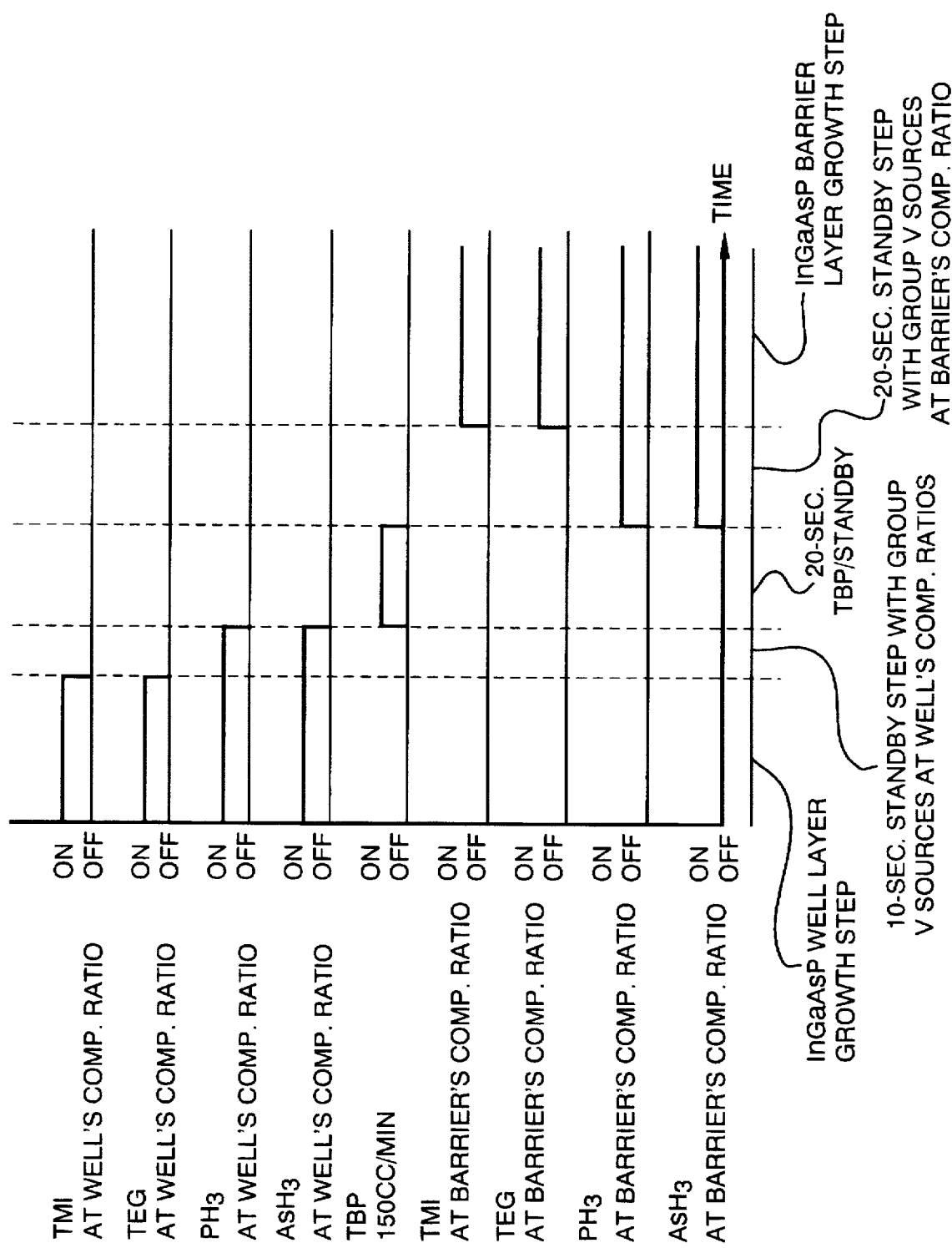
FIG. 2 is a view illustrative of a gas changeover sequence for transition from a well layer to a barrier layer during the process of growth of an InGaAsP MQW structure according to the present invention.

FIG. 2 illustrates a gas changeover sequence for growth of an InGaAsP MQW structure by a method of growth which is according to the invention as claimed in claim 2. The deposition chamber and the growth conditions used were the same as those used in the first embodiment. For the growth of a well layer and a barrier layer there were used TMI and TEG as group III sources, and AsH₃ and PH₃ as group V sources with V/III ratios of 140 and 250, respectively. After the well layer was grown, the flow of the group III sources for the well layer was suspended, and the process was kept on standby for 10 seconds with only a flow of the group V sources with the same composition ratios as in the well layer (standby with group v sources at the well's composition ratios). The process was then kept on standby for 20 seconds while only bubbled TBP was introduced at a flow rate of 150 cc/min at 20° C. (TBP/standby), and then for 20 seconds with a flow of group V sources with the same composition ratios as were designed for the barrier layer (standby with group V sources at the barrier' composition ratios), and after this, sources comprising elements of group III for the barrier layer were introduced to grow a barrier layer, thus realising an InGaAsP MQW structure.

This MQW was buried in a DCPBH structure to prepare a semiconductor layer which was then tested with the following results: for cavity length=300 μm, 30% front coating and 70% back coating, the threshold current was 18 mA, and the slope efficient was 0.32 W/A at 85° C. This is due to improved sharpness of the interface between the well layer and the barrier layer according to the present embodiment.

Figure 3:
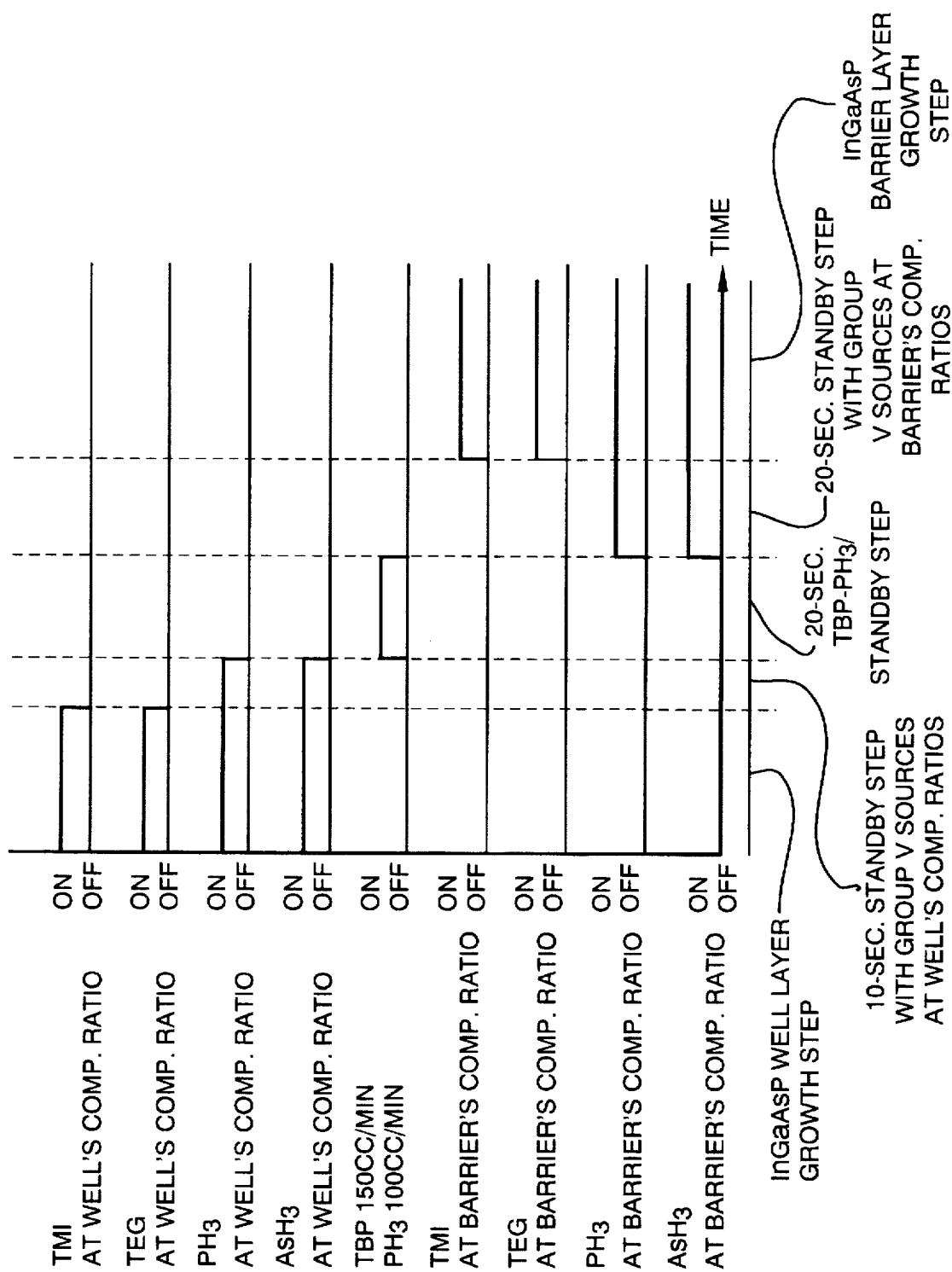
FIG. 3 is a view illustrative of a gas changeover sequence for transition from a well layer to a barrier layer during the process of growth of an InGaAsP MQW structure according to the present invention.

FIG. 3 illustrates a gas changeover sequence for growth is of an InGaAsP MQW structure by a method for growth which is according to the invention as claimed in claim 3. The InGaAsP MQW structure was prepared in the same manner as in the second embodiment except that PH₃ was added at a flow rate of 100 cc/min during the TBP/standby between the duration of the standby with the group V sources at the well's composition ratios and the duration of the standby with the group V sources at the barrier's composition ratios.

This MQW was buried in a DCPBH structure to prepare a semiconductor layer which was then tested with the following results: for cavity length=300 μm, 30% front coating and 70% back coating the threshold current was 15 mA, and the slope efficient was 0.35 W/A at 85° C. Since a higher phosphorus pressure was realized according to the present embodiment, a sharper heterointerface was accomplished between the InGaAsP well and barrier layers, and contributed to the more excellent characteristics of the semiconductor laser.

As described above, the methods for growth by metal organic vapor phase epitaxy according to the present invention allow formation of sharp heterointerfaces in multilayer InGaAsP films of InGaAsP layers of different compositions in terms of elements of group V. The present invention may be applied, with particular advantages, to MQW structures, superlattice structures, etc., the physical properties of which are greatly influenced by the degree of sharpness of the interfaces. For example, application of the present invention to preparation of MQW structures of semiconductor lasers provides noticeable improvements in the characteristics of the lasers.

In addition, although not demonstrated with embodiments, application of the present invention to preparation of superlattice structures of resonance tunnel diodes, and superlattice structures of avalanche photodiodes results in improved device characteristics.

While the present invention has been described in connection with certain preferred embodiments, it is to be understood that the subject matter encompassed by way of the present invention is not to be limited to those specific embodiments. On the contrary, it is intended for the subject matter of the invention to include all alternative, modifications and equivalents as can be included within the spirit and scope of the following claims.

What is claimed is:

1. A method of metal organic vapor phase epitaxy for growth of multiple layer films of InGaAsP having different group V element compositions wherein tertiary-butyl phosphine (TBP) is included in a standby gas flow step which maintains said growth process on standby after growth of a first InGaAsP layer and prior to growth of a second InGaAsP layer wherein said growth of said second InGaAsP layer comprises a gas flow containing a selected group V element composition ratio and said standby gas flow has substantially the same selected group V element composition as said selected group V element composition for growth of said second InGaAsP layer.

2. The method of claim 1 wherein said selected group V element composition ratio comprises As and P.

3. A method of metal organic vapor phase epitaxy for growth of multiple layer films of InGaAsP comprising:

a step of growing a first InGaAsP layer with flows of group III and group V element source gases;

a standby step of turning off said flow of group III element source gases to stop growing said first InGaAsP layer while maintaining a substantially constant flow of group V element source gases including TBP; and a step of growing a second InGaAsP layer having a smaller arsenic concentration than said first InGaAsP layer with flows of group III element source gases and group V element source gases, wherein said constant flow of group V element source gases including TBP used in said standby step has substantially the same group V element composition ratio as for said growth of said second InGaAsP layer.

4. The method of claim 3 wherein said group V element source gases used to grow said second layer comprises As and P at a selected composition ratio, and wherein said group V element source gases using TBP in said standby step has substantially the same selected As and P composition ratio used to grow said second layer.

5. A method of metal organic vapor phase epitaxy for growing multiple laminated films of InGaAsP comprising:

a step of growing a first InGaAsP layer with flows of group III and group V element source gases;

a first standby step of turning off said flow of group III element source gases to stop growing said first InGaAsP layer while keeping a substantially constant flow of group V element source gases, said constant flow of group V element source gases having substantially the same group V element composition ratio as for said growth of said first InGaAsP layer;

a second standby step of having said flow of group III element source gases turned off while having a flow of TBP as the only group V element source gas;

a third standby step of having said flow of group III element source gases turned off while having a flow of group V element source gases; and a step of growing a second InGaAsP layer having a smaller arsenic concentration than said first InGaAsP layer with flows of group III and group V element source gases, wherein said flow of group V element source gases during said third standby step has substantially the same group V element composition ratio as for said growth of said second InGaAsP layer.

6. The method of metal organic vapor phase epitaxy as claimed in claim 3, wherein phosphine is introduced in addition to TBP in said second standby step.

7. The method of claim 3 wherein said group V element source gases used to grow said second layer comprises As and P at a selected composition ratio, and wherein said group V element source gases used during said third standby step has substantially the same selected As and P composition ratio used to grow said second layer.

* * * * *